United States Patent [19]
Tong et al.

[11] Patent Number: 5,719,427
[45] Date of Patent: Feb. 17, 1998

[54] AVALANCHE-ENHANCED CMOS TRANSISTOR FOR EPROM/EEPROM AND ESD-PROTECTION STRUCTURES

[75] Inventors: Paul C. F. Tong, San Jose; Chi-Hung Hui, Cupertino, both of Calif.

[73] Assignee: Pericom Semiconductor Corp., San Jose, Calif.

[21] Appl. No.: 783,626

[22] Filed: Jan. 14, 1997

[51] Int. Cl.$^6$ ............................................ H01L 23/62
[52] U.S. Cl. ...................................... 257/355; 257/316
[58] Field of Search ............................. 257/314, 315, 257/316, 927, 355–363

[56] References Cited

U.S. PATENT DOCUMENTS

| | | | |
|---|---|---|---|
| 4,935,790 | 6/1990 | Cappelletti et al. | 357/23.5 |
| 5,235,541 | 8/1993 | Edme et al. | 365/53 |
| 5,301,150 | 4/1994 | Sullivan et al. | 365/185 |
| 5,322,803 | 6/1994 | Cappelletti et al. | 437/27 |
| 5,337,274 | 8/1994 | Ohji | 257/316 |
| 5,340,760 | 8/1994 | Komori et al. | 437/43 |
| 5,371,393 | 12/1994 | Chang et al. | 257/321 |
| 5,404,037 | 4/1995 | Manley | 257/321 |
| 5,412,238 | 5/1995 | Chang | 257/321 |
| 5,440,159 | 8/1995 | Larsen et al. | 257/318 |
| 5,457,061 | 10/1995 | Hong et al. | 437/43 |
| 5,465,231 | 11/1995 | Ohsaki | 365/185.33 |

OTHER PUBLICATIONS

"A Planar Type EEPROM Cell Structure by Standard CMOS Process for Integration With Gate Array", Ohsaki et al. 1993 IEEE CICC 23.6.1–4.

"A Flash EEPROM Cell with an Asymmetric Source and Drain Structure", Kume et al., 1987 IEDM, 25.8.

"Process and Design Optimization for Advanced CMOS I/O ESD Protection Devices" Daniel & Krieger, 1990 EOS/EDS Sympos. Proceedings, pp. 206–213.

"A Novel Programming Method for High Speed, Low Voltage Flash E2PROM Cells", Ranaweera et al., Solid-State Electronics, pp. 981–989, 1996.

*Primary Examiner*—Tom Thomas
*Assistant Examiner*—David B. Hardy
*Attorney, Agent, or Firm*—Stuart T. Auvinen

[57] ABSTRACT

A non-volatile memory cell uses a p+ diffusion region spaced a lateral distance from the n+ drain of the n-channel programmable transistor. A diode between this p+ diffusion and the n+ drain has a low breakdown voltage because of the close spacing of the high-doping n+ and p+ diffusions. This diode generates electrons when avalanche breakdown occurs. The avalanche electrons are swept up into the programmable gate during programming. Since the avalanche electrons are generated by the diode rather than by the programmable transistor itself, programming efficiency no longer depends on the channel length and other parameters of the programmable transistor. The breakdown voltage of the diode is adjusted by varying the lateral spacing between the n+ drain and the p+ diffusion. Smaller lateral spacing enter avalanche breakdown at lower voltages and thus program the programmable transistor at a lower drain voltage. A drain voltage less than the power supply is possible with the diode, eliminating the need for a charge pump for the drain. A deep p-type implant under the n+ drain can also form the diode. The diode can be used for input-protection (ESD) devices.

18 Claims, 7 Drawing Sheets

AVALANCHE-ENHANCED CMOS TRANSISTOR FOR EPROM/EEPROM AND ESD-PROTECTION STRUCTURES

BACKGROUND OF THE INVENTION—FIELD OF THE INVENTION

This invention relates to CMOS transistors, and more particularly to enhanced programming of electrically-programmable (EPROM & EEPROM) memories.

BACKGROUND OF THE INVENTION— DESCRIPTION OF THE RELATED ART

Complementary metal-oxide-semiconductor (CMOS) processes are commonly used to manufacture logic devices. Such logic devices often use volatile memory cells such as static RAM cells for temporary storage. Unfortunately these volatile memory cells lose their data when power is disconnected. Non-volatile memory cells could provide more permanent storage such as for multipliers and divisors for a programmable clock synthesizer or to disable or enable circuitry. However, non-volatile memories typically require an advanced EEPROM/EPROM process with an extra layer of polysilicon for floating gates, and perhaps a tunneling-oxide layer. Additional processing steps to provide floating gates and tunneling oxide increase the cost and complexity of the CMOS process. Often only a few dozen non-volatile memory cells are needed, and the increased processing costs make these few non-volatile memory cells expensive.

A non-volatile EEPROM (electrically-erasable programmable read-only memory) cell using standard CMOS transistors has been disclosed by Ohsaki in U.S. Pat. No. 5,465,231. Double-poly transistors are not needed, so a standard CMOS process can be used. Thus Ohsaki's non-volatile, single-poly memory cell can be used on standard logic devices without additional processing steps.

FIG. 1 is a schematic of a single-poly EEPROM cell using standard CMOS transistors. The single-poly EEPROM cell contains two transistors. N-channel transistor 12 has its source connected to ground and its drain connected to a bit line (BL) which acts as a data output of the memory cell, perhaps connecting to some kind of sense amplifier. P-channel transistor 14 has its source, drain, and N-well tap connected together. The source and drain receive an input or select signal and function as a word line (WL). P-channel transistor 14 and n-channel transistor 12 have their gates 18, 19 connected to each other. Gates 18, 19 do not connect to any other devices or nodes. Thus gates 18, 19 function as the floating gate in Ohsaki's EEPROM cell.

FIG. 2 is a cross-sectional diagram of a single-poly EEPROM cell highlighting programming by channel hot electron (CHE) injection near the n-channel drain. P-channel transistor 14 is formed in an N-well and has its source and drain p+ and n-well tap diffusions connected together and to word line WL. Gate 18 of p-channel transistor 14 is connected to gate 19 of n-channel transistor 12 but otherwise isolated from other circuitry.

N-channel transistor 12 is formed in the p-type substrate where n+ diffusions are made for source and drain regions on opposite sides of gate 19. Source 17 is connected to ground while drain 16 is connected to bit line BL.

In operation, floating gates 18, 19 are charged to alter the effective threshold of n-channel transistor 12. To program the EEPROM cell, a moderate voltage (7 volts) is applied to drain 16 while source 17 is held at ground. A positive high-voltage level (12 volts) applied to word line WL (the control gate) is capacitivly coupled to floating gates 18, 19. Under this bias condition, n-channel transistor 12 operates in the saturation mode where a steady stream of electrons flow from source 17 to drain 16. While traversing the channel under transistor 12, the electrons enter the higher E-fields (>0.1 MV/cm) surrounding the drain depletion region. At this point the rate of energy gained from the E-field can no longer be described by the temperature of the silicon lattice; hence the term "hot electron". Once these electrons gain sufficient energy, they can surmount the energy barrier of about 3.2 eV across the Si-SiO$_2$ interface. The high positive voltage applied to the control gate helps to pull the electrons toward floating gate 19. Some of the hot electrons can also create electron-hole pairs which result from impact ionization near drain 16. Hence channel hot electron (CHE) injection also includes hot electron injection due to impact ionization of channel current near drain 16. Electrons with sufficient energy reach floating gate 19 and increase the negative charge on gate 19, increasing the threshold voltage of n-channel transistor 12.

After programming is complete, the EEPROM cell has a negative charge remaining on gates 18, 19. This negative charge raise the voltage needed to turn on n-channel transistor 12. A read voltage applied to word line WL is capacitively coupled through p-channel transistor 14 to gate 19 of n-channel transistor 12. The remaining negative charge on gates 18, 19 require a higher read voltage to offset the negative charge on gate 19 of transistor 12. Thus the effective threshold voltage has been raised by programming.

When the read voltage is less than the effective threshold voltage, then n-channel transistor 12 is not turned on and bit line BL is not pulled to ground. However, and un-programmed EEPROM cell has a lower effective threshold voltage and the read voltage is sufficient to turn on transistor 12, pulling bit line BL to ground.

While the single-poly EEPROM cell of FIGS. 1, 2 can easily be integrated onto a logic or analog CMOS integrated circuit (IC), several drawbacks exist. The programming voltage required is about 7 volts on BL, while the WL voltage during programming is about 12 volts. These programming voltages can be supplied by external pins on the IC, but pins are a scarce resource on many logic IC's. An on-chip charge pump may be used, but only a relatively small current can be driven by a reasonably large charge pump. The WL (gate) voltage does not require a large current, but the BL (drain) voltage (7 volts) does require a large current. Several milliamps are typically required for the programming current to the drain. The number of EEPROM cells which can simultaneously be programmed is limited when a large current is needed.

Another drawback is that the strength of the electric field depends on the channel length of n-channel transistor 12. Longer channel lengths reduce the strength of the electric field and thus reduce programming efficiency. Indeed, the current characteristics of n-channel transistor 12 can affect the programming current available. Thus programming is strongly dependent on the electrical characteristics of n-channel transistor 12. The programming characteristics of transistor 12 must be traded off against the read characteristics of transistor 12, complicating design. All cells ordinarily have the same programming voltage, which complicates tier programming.

A final drawback is scaling the device. As the transistor's channel length is reduced to the half-micron region as processing technology improves, the drain voltage must be reduced to avoid punch-through from drain to source. A lower drain voltage must be used for programming, which reduced programming efficiency. Thus programming efficiency is tightly coupled to transistor characteristics and programming time to achieve a pre-determined threshold-voltage shift.

FIG. 3 is a diagram of a prior-art dual-poly EEPROM cell. Dual-poly transistor 20 has a floating polysilicon gate 24 formed by additional process steps and a second poly layer. Floating polysilicon gate 24 is electrically isolated from all circuitry. Control gate 22 is positioned above floating polysilicon gate 24. Drain 26 is connected to bit line BL while control gate 22 is connected to word line WL. The source is grounded.

The standard dual-poly EEPROM cell is widely known and many variants of it have been proposed. J. Ranaweera et al. (Solid-State Circuits, Vol. 39, No. 7, pp. 981–9, 1996) have proposed enhancing hot electron generation by placing p+ implants under the polysilicon gate of the n-channel transistor.

FIG. 4 is a cross-sectional diagram of a dual-poly EEPROM cell with p+ implants under the gate to enhance hot electron generation. N-channel transistor 20 has a floating poly gate 24 which is isolated. Control gate 22 is located above floating poly gate 24 and is connected to word line WL. Drain 26 is connected to bit line BL while the source is grounded.

Under-gate p+ implants 28, 30 extend under half of the width of transistor 20, so that a programming half of the width of transistor 20 has under-gate p+ implants 28, 30, while a read half of transistor 20 does not have under-gate p+ implants 28, 30. Under-gate p+ implants 28, 30 are located under gates 22, 24 in the channel region of transistor 20. An extra p+ implant step to form under-gate p+ implants 28, 30 is performed after gate patterning but before side-wall spacer formation.

Only half of the width of the transistor's gate can have under-gate p+ implants 28, 30, because the p+ implant greatly increases the threshold voltage. Thus a conducting n-channel is not formed through under-gate p+ implants 28, 30. Transistor 20 must be made twice as wide as previous dual-poly EEPROM transistors for a desired current drive.

Under-gate p+ implants 28, 30 create a n+ to p+ junction with the source and drain n+ regions. The sharp n+/p+ junction has a very high electric field which easily creates hot electrons. The junction serves to generate high-energy electrons which are swept up into floating poly gate 24 when a high programming voltage is applied to control gate 22 and to drain 26.

While programming is facilitated, the transistor width is doubled since the p+ implants are placed under the floating poly gate. An extra masking step and an extra implant step are needed to define the p+ implant since the p+ implant is intended to go only half of the device's width. Another disadvantage is that a floating-gate process is used, so integration with a CMOS logic process is expensive as the second poly layer is added as well as the extra p+ implants.

What is desired is a single-layer polysilicon EPROM/ EEPROM cell using a standard CMOS logic-chip process. It is desired to improve the generation of electrons by avalanche breakdown of a p-n junction rather than by channel hot-electron injection. It is desired to separate the generation of hot electrons from the EPROM/EEPROM read transistor to separately optimize hot electron generation without degrading the speed of the programmable transistor. It is desired to adjust the avalanche breakdown voltage where hot electrons are generated so that different transistors can have different programming voltages.

It is further desired to improve the efficiency of generation of avalanche-breakdown electrons so that a smaller voltage is needed to initiate avalanche breakdown. Thus the power supply rather than a charge pump can be used. It is also desired to use an avalanche-electron-generating structure for input-protection (ESD) devices.

SUMMARY OF THE INVENTION

An avalanche-enhanced transistor has a source diffusion and a drain diffusion of a first conductivity type in a substrate of an opposite conductivity type. A channel region in the substrate is between the source diffusion and the drain diffusion to selectively conduct current between the source diffusion and the drain diffusion. A control gate controls the current between the source diffusion and the drain diffusion.

An avalanche-generating diffusion of the opposite conductivity type is in close proximity to the drain diffusion. Most of the avalanche-generating diffusion is not located directly between the source diffusion and the drain diffusion. The avalanche-generating diffusion and the drain diffusion form an avalanche-breakdown diode. When a critical reverse voltage bias is applied to the avalanche-breakdown diode between the drain diffusion and the avalanche-generating diffusion, an electric field between the drain diffusion and the avalanche-generating diffusion is sufficiently intense to initiate avalanche breakdown. The avalanche-breakdown diode conducts in a reverse direction when the critical reverse voltage bias is applied.

Thus the avalanche-generating diffusion in close proximity to the drain diffusion initiates avalanche breakdown when the critical reverse voltage bias is applied.

In further aspects of the invention the critical reverse voltage bias is less than a transistor channel-avalanche voltage when a channel bias is applied between the source diffusion and the drain diffusion. The channel bias is sufficient to generate avalanche breakdown in the channel between the source diffusion and the drain diffusion. Thus avalanche breakdown occurs at a lower voltage in the avalanche-breakdown diode than in the channel of the avalanche-enhanced transistor.

In other aspects the control gate is connected to a constant-voltage terminal. The variable-voltage signal is connected to the drain diffusion and is connected to an input/output pad of an integrated circuit. The avalanche-enhanced transistor provides protection from electro-static discharges applied to the input/output pad.

In further aspects the constant-voltage terminal is selected from the group consists of a ground supply terminal and a power-supply terminal.

In other aspects the avalanche-enhanced transistor is a non-volatile memory cell. The control gate is isolated from all D.C. current sources and sinks, and the variable-voltage signal is connected to the drain diffusion is connected to a bit line. A programming means capacitively couples a gate programming voltage into the control gate and applies the critical reverse voltage bias to the drain diffusion. The avalanche-breakdown diode generates high-energy charged carriers when the critical reverse voltage bias is applied. The high-energy charged carriers are injected into the control gate when the gate programming voltage is coupled to the control gate. Thus the high-energy charged carriers change a charge on the control gate to program the non-volatile memory cell.

In further aspects of the invention the avalanche-generating diffusion is laterally separated from the drain diffusion by the substrate. A lateral distance from the drain diffusion to the avalanche-generating diffusion determines a magnitude of the critical reverse voltage bias when avalanche breakdown occurs. In other aspects the avalanche-generating diffusion is located directly underneath the drain diffusion.

DETAILED DESCRIPTION

The present invention relates to an improvement in non-volatile memory cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
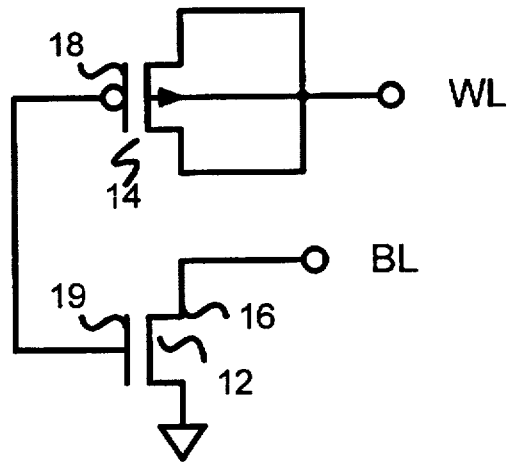
FIG. 1 is a schematic of a single-poly EEPROM cell using standard CMOS transistors.
Figure 2:
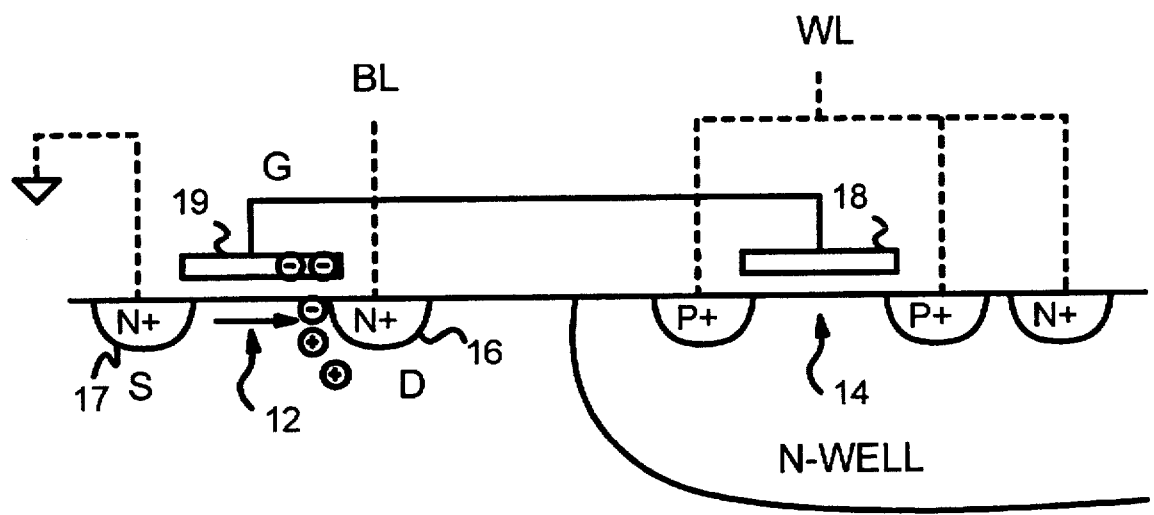
FIG. 2 is a cross-sectional diagram of a single-poly EEPROM cell highlighting programming by channel hot-electron (CHE) injection breakdown near the n-channel drain.
Figure 3:
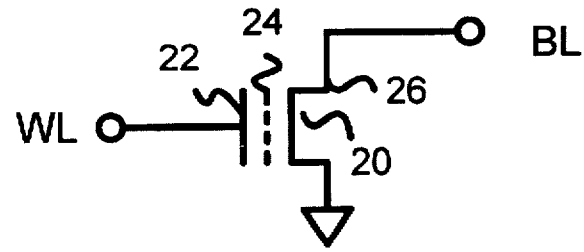
FIG. 3 is a diagram of a prior-art dual-poly EEPROM cell.
Figure 4:
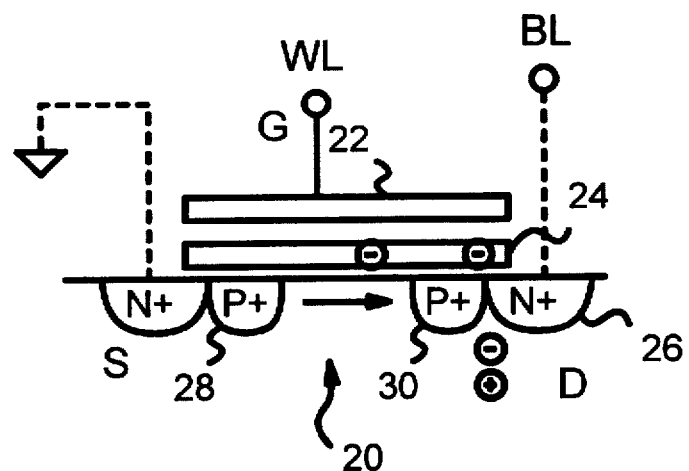
FIG. 4 is a cross-sectional diagram of a dual-poly EEPROM cell with p+ implants under the gate to enhance avalanche hot-electron generation.

The inventors have realized that the p+ implants for promoting hot-electron generation by avalanche breakdown of the p+/n+ drain junction (FIG. 4) do not need to be under the gate. Instead, the p+ region can be located next to the drain's n+ diffusion, but not under the gate itself. This placement avoids the drawbacks of J. Ranaweera's device. The transistor's gate width no longer has to be doubled because the p+ implant is no longer in the n-channel area. Extra process steps are no longer needed to define and implant the p+ regions under the gate. The p+ implant which forms the p+ sources and drains of PMOS transistors is used to form the p+ avalanche-generating regions, since they are no longer hidden under the poly gates.

Thus moving the p+ region from under the gate to next to the drain reduces the size of the programmable transistor and reduces process steps. Traditional thinking is that programming efficiency would decrease because the avalanche electrons are generated farther away from the gate, whereas having the p+ regions under the gate ensures that the electrons are generated as close to the floating gate as possible. However, the inventors have realized that electrons can still diffuse or be drawn over to the floating gate even when generated some distance away from the gate.

While J. Ranaweera teaches a dual-poly cell, the inventors have realized that a single-poly EEPROM cell could be built using a p+ region to generate hot electrons induced by avalanche breakdown for programming. While the p+ regions could be placed under the gate as taught by J. Ranaweera, the inventors have also realized that a p+ region located more remotely from the floating gate can yield surprisingly high programming efficiencies despite the greater distance to the floating gate.

REMOTE P+ REGION GENERATES AVALANCHE ELECTRONS

Figure 5:
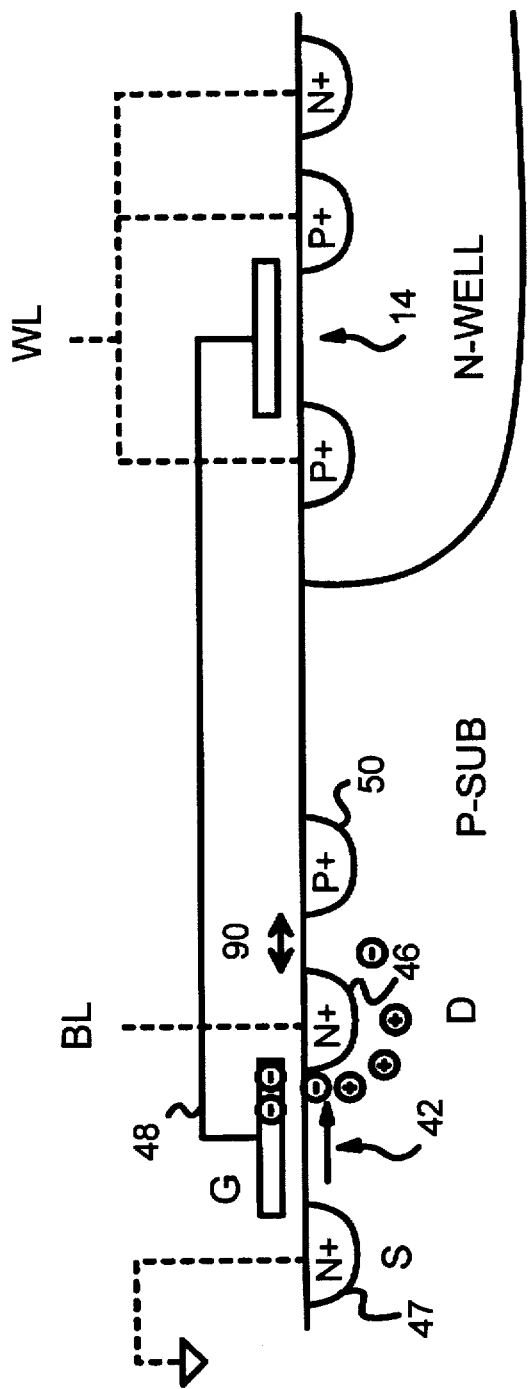
FIG. 5 is a cross-sectional diagram of a single-poly non-volatile memory cell with a remote p+ region for generating avalanche hot electrons.

FIG. 5 is a cross-sectional diagram of a single-poly non-volatile memory cell with a remote p+ region for generating hot electrons by avalanche breakdown. P-channel transistor 14 acts as a coupling capacitor to capacitively couple voltage changes on word line WL to gate node 48. Gate node 48 is connected between the polysilicon gate of p-channel transistor 14 and the polysilicon gate of n-channel transistor 42. Gate node 48 is electrically isolated from all other circuitry such as direct-current (D.C.) current sinks and sources. Only higher-frequency signals can be capacitively coupled into gate node 48. Thus gate node 48 substitutes for the floating-poly layer of a double-poly EPROM/EEPROM transistor.

Source 47 of n-channel transistor 42 is connected to ground, while drain 46 is connected to a bit line or other output for reading and programming the memory cell. Reading the memory cell is accomplished by applying a moderate read voltage to word line WL, which is capacitively coupled to gate node 48. When the cell has not been programmed, no negative charge is on gate node 48, and the coupled voltage from word line WL is greater than the transistor threshold voltage so that n-channel transistor 42 turns on. Current is conducted from bit line BL through drain 46 to the grounded source 47 through a conducting channel under n-channel transistor 42.

When a negative charge has been programmed onto gate node 48, the effective threshold voltage required to turn on n-channel transistor 42 is increased by the negative charge on gate node 48. In normal operation, the word-line voltage is not sufficient to offset this negative charge and turn on n-channel transistor 42. Thus reading the programmed memory cell does not turn on transistor 42, and little or no current is conducted from bit line BL through drain 46.

P+ avalanche-generator 50 is a p+ implanted region that is not under the polysilicon gate of n-channel transistor 42. Instead, p+ avalanche-generator 50 is adjacent to drain 46, but not under the gate. A gap or spacing 90 may separate p+ avalanche-generator 50 from drain 46.

By adjusting spacing 90 the p-dopant concentration is modulated at the immediate vicinity of n+ drain 46. P+ region 50 can be modulated as a source of p+ dopants from which the p+ dopant will diffuse outwards, in decreasing concentration as it gets further away from the p+ region 50. Hence by placing p+ region 50 very close to n+ drain 46, the doping densities of both p and n sides is greater than $10^{18}/cm^3$. The depletion region at the junction is very thin and an electric field (>1 MV/cm) necessary for zener breakdown is reached. Similarly, if spacing 90 is large enough that the electric field within depletion region is <1 MV/cm, then the p-n junction can only experience avalanche breakdown.

LOW-BREAKDOWN DIODE FORMED ADJACENT TO PROGRAMMABLE GATE

The n+ doping of drain 46 is typically about $1\times10^{20}$ ions/cm$^3$, while the doping concentration of p+ avalanche-generator 50 which depends on its spacing from drain 46, is about $1\times10^{20}$ ions/cm$^3$ at the center, but drops to about $1\times10^{18}$ ions/cm$^3$ at the junction edge. Thus the depletion-region width in the n+ area is two orders of magnitude smaller than the depletion width in the p+ region. Since most of the depletion-region width is in p+ avalanche-generator 50, most of the voltage drop occurs across the p+ region.

HIGH DOPING CREATES HIGH ELECTRIC FIELD

The narrow depletion-region width causes a high electric field, as the entire voltage bias from p+ to n+ is dropped across the depletion region. This high electric field causes an avalanche breakdown as electrons are accelerated as they drift into the depletion region. The high energy of the electrons can be large enough to break other electrons free from the silicon lattice, causing a chain reaction or avalanche as more and more electrons are freed and accelerate and knock other electrons free.

Thus p+ avalanche-generator 50 is a generator of free electrons. Some of these free electrons diffuse out of the depletion region and then over to the channel region under the gate of n-channel transistor 42. If a sufficiently high gate programming voltage is applied to word-line WL and coupled to gate node 48, then some of these free electrons are drawn up into gate node 48 from the channel region around drain 46.

Normal design and layout rules do not allow a p+ region to be located close to an n+ region unless both regions are biased at the same potential. These design rules thus avoid an avalanche breakdown which is undesirable under normal circumstances. The inventors break this design rule by placing a p+ region, biased to ground by the p-type substrate, close to n+ drain 46 which is biased to the bit-line's potential. During programming, a high voltage is applied to drain 46 by bit line BL, while p+ avalanche-generator 50 is biased to the potential of the p-type substrate, which is normally biased to ground.

EARLY AVALANCHE BREAKDOWN AT POWER-SUPPLY VOLTAGE

The voltage required to initiate avalanche breakdown of this p-n junction is low since both n+ and p+ have high dopings and the depletion region is therefore narrow. With sufficiently high dopings and close proximity of the n+ and p+ regions, avalanche breakdown can begin at under the power-supply voltage.

DRAIN CHARGE PUMP NOT NEEDED WITH LOW-VOLTAGE AVALANCHE

When hot-electron generation occurs at the power-supply voltage, a charge pump is no longer needed, saving die area and design complexity. The power supply can provide a much larger programming current than most charge pumps. The power-supply voltage is simply applied to bit line BL to initiate avalanche breakdown from n+ drain 46 to p+ avalanche-generator 50. A higher voltage may be applied to word line WL for programming, but since gate node 48 is isolated, no significant programming current flows from word line WL. Thus a small charge pump can be used to generate the higher gate programming voltage. A charge pump for the drain is not needed. Since the power supply provides the programming current, many cells can be programmed at the same time, such as in byte-wide programming.

Figure 6:
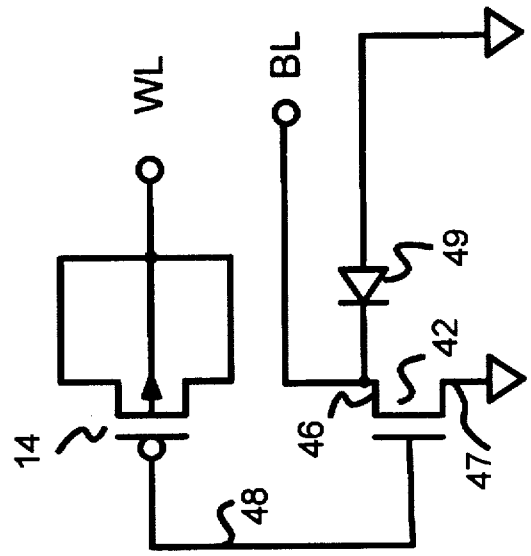
FIG. 6 is a schematic of a single-poly non-volatile memory cell with a remote p+ region for generating hot electrons by avalanche breakdown.

FIG. 6 is a schematic of a single-poly non-volatile memory cell with a remote p+ region for generating hot electrons by avalanche breakdown. The single-poly non-volatile memory cell contains two transistors. N-channel transistor 42 has its source 47 connected to ground and its drain connected to a bit line (BL) which acts as a data output of the memory cell, perhaps connecting to some kind of sense amplifier. P-channel transistor 14 has its source, drain, and n-well tap connected together. The source, drain, and n-well tap receive an input or select signal such as a word line (WL). P-channel transistor 14 and n-channel transistor 42 have their gates connected to each other as gate node 48. Gate node 48 do not connect to any other devices or nodes. Thus gate node 48 are isolated from other circuitry outside the non-volatile memory cell.

Diode 49 is formed between n+ drain 46 and p+ avalanche-generator 50 of FIG. 5. Drain 46 forms one terminal of diode 49, while p+ avalanche-generator 50 forms the other terminal of diode 49, which is connected to the substrate ground.

LAYOUT OF CELL WITH P+ AVALANCHE-ELECTRON GENERATOR

Figure 7:
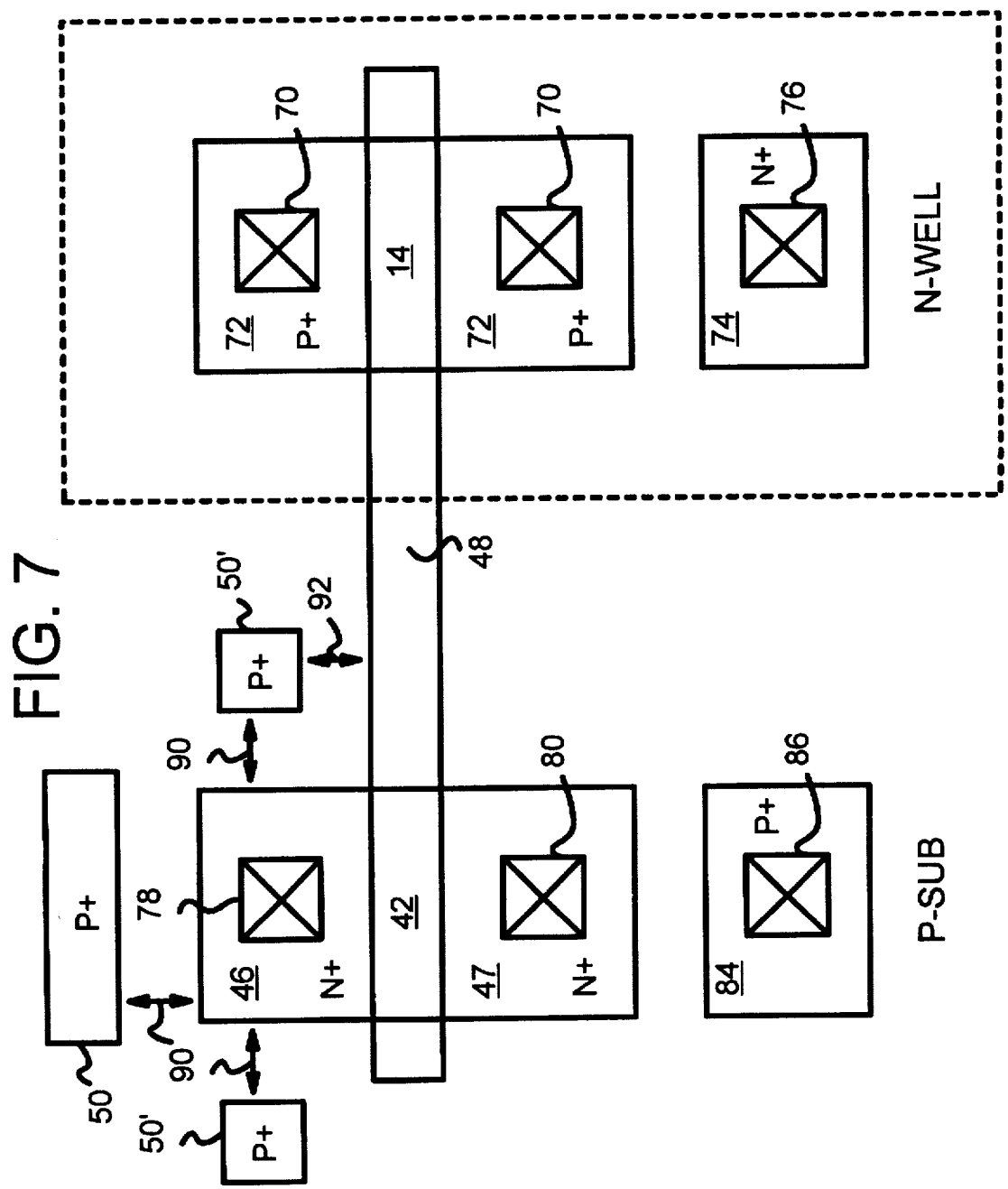
FIG. 7 is a layout diagram of a single-poly non-volatile memory cell using a remote p+ region to generate hot electrons by avalanche breakdown for programming.

FIG. 7 is a layout diagram of a single-poly non-volatile memory cell using a remote p+ region to generate hot electrons by avalanche breakdown for programming. P-channel transistor 14 is formed by a conductive polysilicon line passing over an active area. P+ source/drain areas 72 are formed by implanting a p+ dopant into these active areas. P+ source/drain areas 72 are self-aligned to the gate of transistor 14 since p+ dopants are blocked by the polysilicon gate layer. Metal contacts 70 electrically connect p+ source/drain areas 72 to word line WL in a metal layer (not shown).

P-channel transistor 14 is formed in an N-well, which is the fourth or "substrate" terminal of transistor 14. The N-well is connected to the source and drain of p-channel transistor by N-well tap 74, which is an n+ active area. Metal contact 76 connects N-well tap 74 to source/drain areas 72 (not shown). The p-type substrate also contains a biasing tap, substrate tap 84. Substrate tap 84 is a p+ active area in the p-type substrate outside of the N-well. Metal contact 86 connects substrate tap 84 to a ground metal line (not shown). Thus the p-type substrate is biased to ground.

Gate node 48 can be a single line of polysilicon as shown. Gate node 48 forms n-channel transistor 42 where polysilicon crosses over an active area in the p-type substrate. Active areas in both the N-well and the p-type substrate are formed by growing a thick field oxide over non-active areas. A thin gate oxide is grown over active areas before polysilicon is deposited and etched.

N+ source 47 and n+ drain 46 are formed by implanting n+ dopant such as arsenic into n+ active areas in the p-type substrate. The implant step self-aligns the source and drain diffusions to the poly gate. Metal contact 78 connects drain 46 to bit line BL, typically a metal line (not shown). Metal contact 80 connects source 47 to a ground metal line (not shown).

Additional p+ active areas a distance 90 from drain 46 are formed and implanted with p+ dopant to create p+ avalanche-generator 50, 50'. These active areas are also at least distance 92 from any polysilicon lines. Distance 92 is typically 0.3 to 1.0 microns for an 0.8 μm process. These p+ active areas form a zener or avalanche diode with n+ drain 46 when distance 90 is sufficiently small and a reverse bias is applied. Depending on the size of drain 46, p+ avalanche-generator 50 behind drain 46 may be less effective than p+ avalanche-generator 50' on the sides of drain 46, closer to the gate and channel of transistor 42.

All p+ active areas are implanted simultaneously. Thus p+ source/drain areas 72, p+ substrate tap 84, and p+ avalanche-generator 50, 50' are implanted with the same dose of the p+ dopant. A single step is used rather than multiple steps. Thus p+ avalanche-generator 50, 50' requires no additional processing steps to form.

The layout of FIG. 7 is not an exact scale view of an actual layout, but is meant to convey the concepts of the invention. Different processes have different design rules and the relative dimensions of the various components can vary. In particular, the spacing between transistors 14, 42 is anticipated to be greater due to a design rule for a large spacing between active areas in different wells. The p-type substrate is often formed as a second P-well, or the N-well could be an n-type substrate.

VARIABLE DISTANCE TO P+ ADJUSTS BREAKDOWN VOLTAGE

Figure 8A:
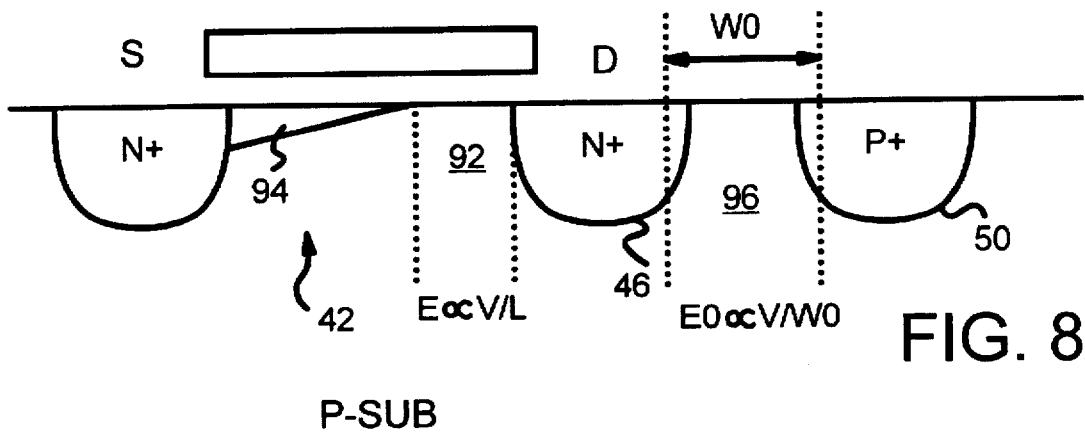
FIGS. 8A, 8B, 8C show that the electric field strength and thus the avalanche breakdown voltage can be adjusted by changing the lateral spacing from n+ to p+.
Figure 8B:
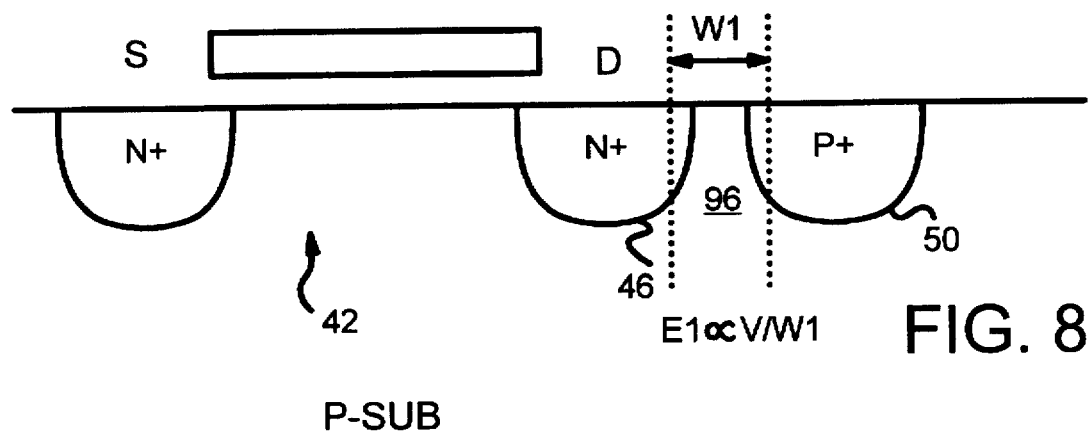
Figure 8C:
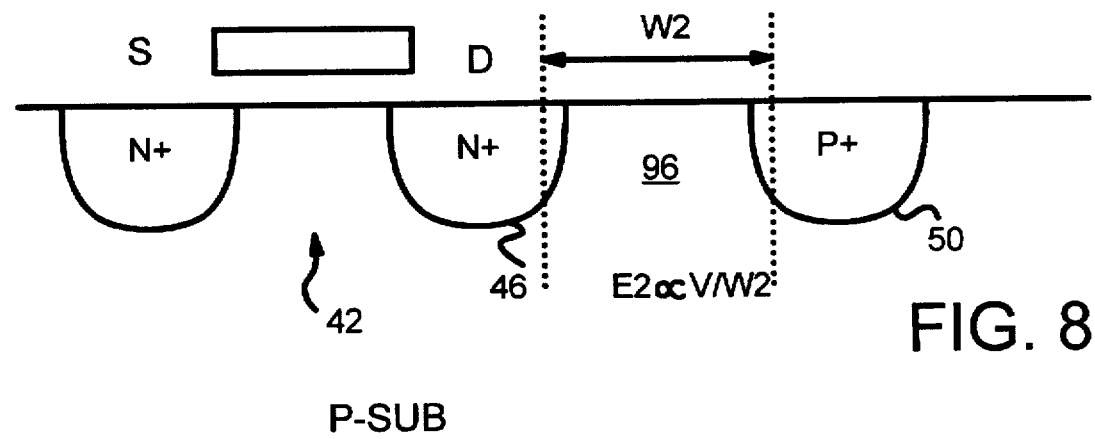

FIGS. 8A, 8B, 8C show that the electric field strength and thus the avalanche breakdown voltage can be adjusted by changing the lateral spacing from n+ to p+. The inventors have realized that the magnitude of the avalanche breakdown voltage can be adjusted by changing the lateral distance from n+ drain 46 to p+ avalanche-generator 50. FIGS. 8A, 8B, 8C each show n-channel transistor 42 with n+ drain 46 and p+ avalanche-generator 50. In FIG. 8A, a conducting channel 94 is temporarily created under the gate of transistor 42 when the gate voltage exceeds the transistor's threshold voltage. When the drain voltage is high, transistor 42 operates in the saturated region of operation rather than the linear region. Pinch-off region 92 occurs during saturation between the end of channel 94 and drain 46. A large voltage drop can occur here, creating an electric field with a strength E proportional to V/L ($E \propto V/L$), where L is the length of pinch-off region 92. The strength of the electric field E depends on this length L, which depends on the length of channel 94 and other properties of transistor 42. The electric field strength and the efficiency of generating avalanche electrons and of programming all depend on length L for prior-art non-volatile programmable transistors of Ohsaki. Avalanche electrons for programming are typically generated here in most prior-art EPROM/EEPROM devices.

The lateral distance from drain 46 to p+ avalanche-generator 50 is variable, and shown in FIG. 8A as W0. The strength of the electric field across depletion region 96 is $E0 \propto V/W0$, where V is the reverse-bias voltage between n+ drain 46 and p+ avalanche-generator 50. Since p+ avalanche-generator 50 is formed in the p-substrate biased to ground, p+ avalanche-generator 50 is at ground potential. V is then the drain voltage applied by bit line BL.

The area between n+ drain 46 and p+ avalanche-generator 50 is the p-type substrate, which has a low doping. Low voltages V do not produce a sufficiently wide depletion region 96 to reach all the way across from n+ drain 46 to p+ avalanche-generator 50. Instead, depletion region 96 ends in the p-type substrate. Once a sufficiently high voltage V is applied, depletion region 96 reaches all the way across to p+ avalanche-generator 50. The high doping of the p+ region results in smaller increases in the width of depletion region 96 as the voltage continues to increase. Thus once depletion region 96 reaches the p+ region, additional increased in voltage do not significantly increase the width. These increases in the voltage instead increase the electric field.

Before depletion region 96 reaches p+ avalanche-generator 50, increases in voltage also increase the depletion-region width, and thus the electric field strength does not increase substantially. Thus avalanche breakdown does not occur until depletion region 96 reaches all the way across to p+ avalanche-generator 50. Once the p+ region is reached, large voltage increases and eventually avalanche breakdown occur with relatively little increase in depletion-region width. Thus the lateral distance from n+ to p+ is critical in determining the avalanche breakdown voltage.

Normally distance W0 is large while L is small, and thus the electric field is greater under the gate. Avalanche electrons are formed at the strongest electric field. However, as the distance W0 is reduced, the electric field E0 increases proportionately. FIG. 8B shows that when W is reduced to W1, the electric field across depletion region 96 increases to $E1 \propto V/W1$. FIG. 8C shows that a wider distance W2 produces a wider depletion region 96 and a lower electric field $E2 \propto V/W2$.

Thus varying the lateral distance W between n+ drain 46 and p+ avalanche-generator 50 changes the strength of the electric field at a fixed reverse voltage bias. The critical electric field at which avalanche breakdown occurs is typically a fixed field strength. This critical field strength is reached at lower voltages for smaller lateral distances such as W1 than for larger lateral distances such as W2. Thus varying the lateral distance allows the avalanche breakdown voltage to be adjusted to a desired value. In particular, breakdown voltages slightly below the power-supply voltage are desirable as a drain charge pump is then no longer needed.

ADJUSTABLE BREAKDOWN ALLOWS FOR TIER PROGRAMMING

Tier programming is an application where several programmable cells with different required programming voltages are connected together, perhaps sharing a bit or word line, and individually programmed by gradually incrementing the programming voltage.

Lower programming voltages program some cells but not other cells with higher required programming voltages.

The invention supports tier programming by providing a convenient way to vary the required programming voltage of individual cells on a chip. Cells with a smaller distance W from the n+ drain to the p+ avalanche-generating region reach the critical electric field for avalanche breakdown at lower voltages than cells with larger lateral distances W. Thus the programming voltage can be "dialed in" to a desired value merely by adjusting the lateral distance. Since this lateral distance is determined by the layout, the circuit designer can dial in the desired programming voltage without changing processing parameters.

DEEP P-TYPE IMPLANT EMBODIMENT

Figure 9:
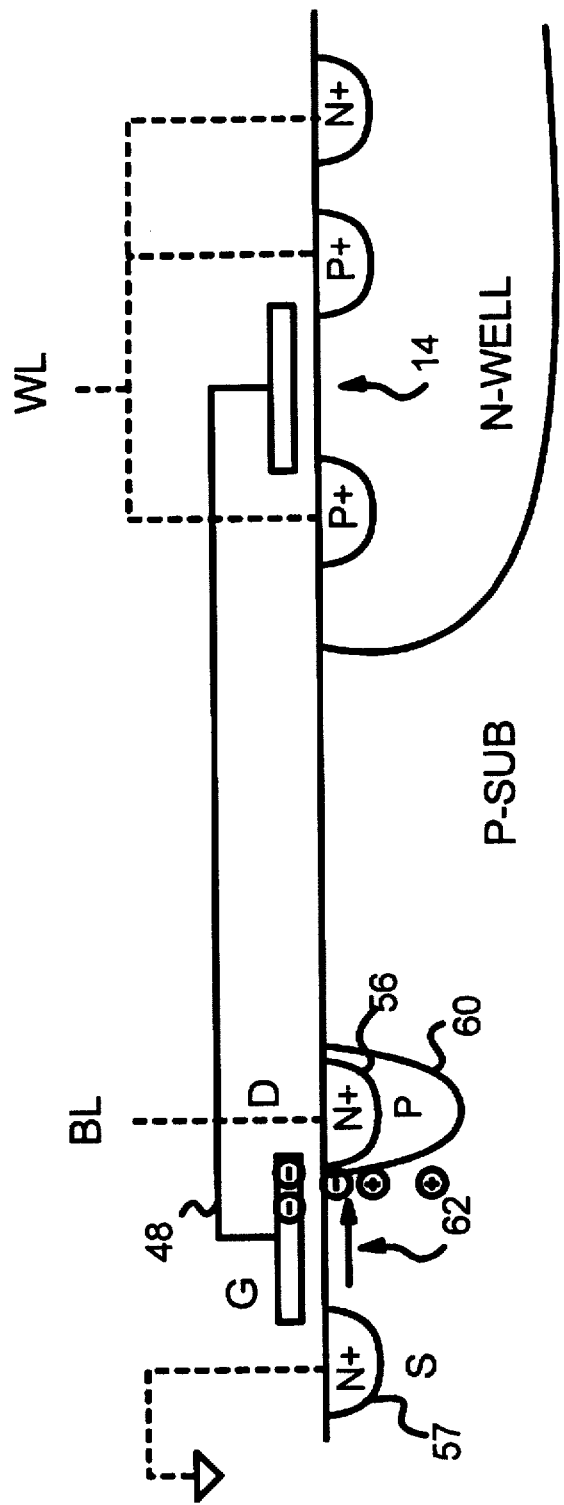
FIG. 9 is a cross-sectional diagram of a non-volatile memory cell with a deep p-type implant under the n+ drain to enhance hot-electron generation efficiency.

FIG. 9 is a cross-sectional diagram of a non-volatile memory cell with a deep p-type implant under the n+ drain to enhance hot-electron generation efficiency. A single-poly cell is shown, with p-channel transistor 14 capacitively coupling word line WL to gate node 48 which couples the gates of p-channel transistor 14 and n-channel transistor 62. Source 57 is grounded, while drain 56 is connected to bit line BL.

A deep p-type implant is performed as a separate step to form deep p-type region 60. Deep p-type region 60 acts as a generator of avalanche electrons which are swept up into gate node 48 when a sufficiently high word-line voltage is applied during programming. Arsenic is often used as the n+ dopant, while the much lighter boron ions are used as p-type dopants. The lighter Boron ions can be implanted through the relatively shallow n+ drain 56 to form region 60 below drain 56.

A vertical diode is formed by n+ drain 56 and deep p-type region 60. Its breakdown voltage can be adjusted by changing the concentration and energy of the p-type implant.

A p-type dose of $1 \times 10^{13}$ to $1 \times 10^{14}$ ions/cm$^3$ is anticipated. This embodiment has the disadvantages that extra processing steps are required to form the vertical diode, and that the breakdown cannot be adjusted by the layout. The process must be changed to vary the breakdown and programming voltages. Also, all memory cells have the same programming voltage when a single p-type implant is used for all cells.

APPLICATION TO ESD-PROTECTION DEVICES

The invention may be applied to input-protection devices commonly known as electrostatic-discharge (ESD) devices. The avalanche-generating p+ region can be placed adjacent to a transistors in an ESD-protection structure to enhance the generation of avalanche electrons which are used for punch-though rather than programming.

Figure 10:
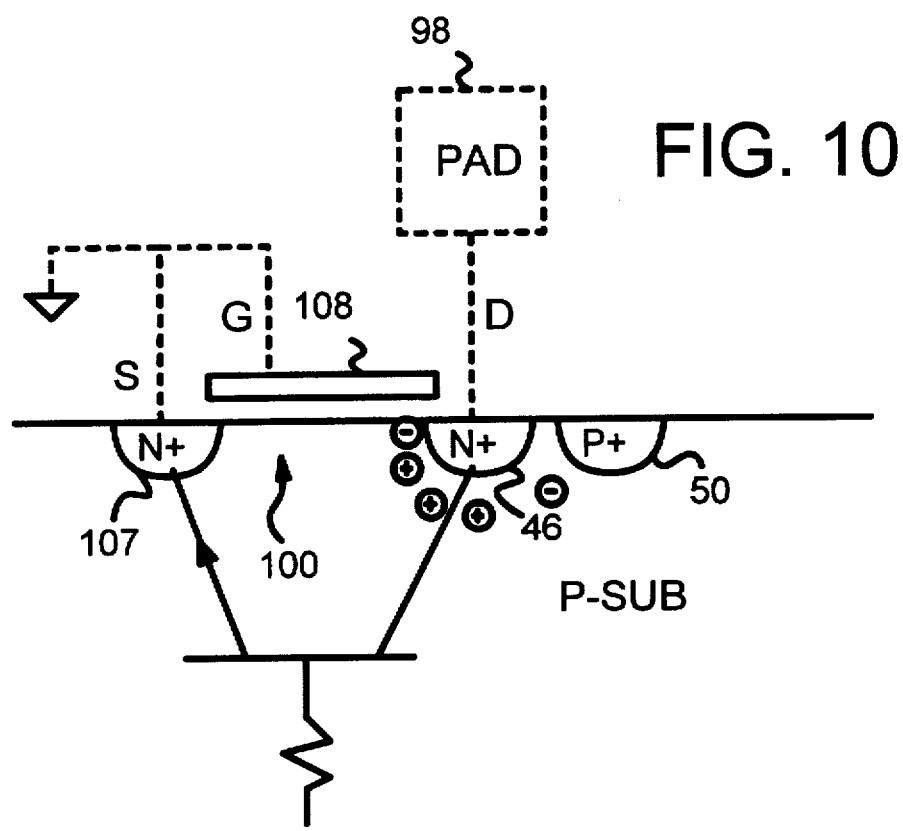
FIG. 10 shows a punch-though transistor in an ESD-protection circuit which uses a p+ region to generate avalanche electrons to reduce the breakdown voltage of the punch-through transistor.

FIG. 10 shows a punch-though transistor in an ESD-protection circuit which uses a p+ region to generate avalanche electrons to reduce the breakdown voltage of the punch-through transistor. Punch-through transistor 100 has its gate 108 and source 107 connected to ground, while drain 46 is connected to I/O pad 98 of the integrated circuit (IC) chip.

A diode is formed from n+ drain 46 to p+ avalanche-generator 50. As the lateral spacing from n+ to p+ is reduced, the critical electric field when avalanche begins occurs at lower breakdown voltages. When avalanche electrons are generated, they travel over to the channel region of punch-thorough transistor 100, where they form a current path from drain 46 to source 107. Holes flow toward the substrate, developing a potential across the parasitic substrate resistor. As soon as the base-emitter junction reaches about 0.6 volt, the parasitic NPN transistor turns on and shunts the ESD current on I/O pad 98. Thus the breakdown voltage of punch-through transistor 100 can be adjusted to a desired value by changing the layout. Prior-art ESD devices typically have breakdown voltages of 12 or 13 volts; the invention can reduce the breakdown voltage to 5-7 volts using n+ to p+ spacing of 0.3 to 1 micron.

Figure 11:
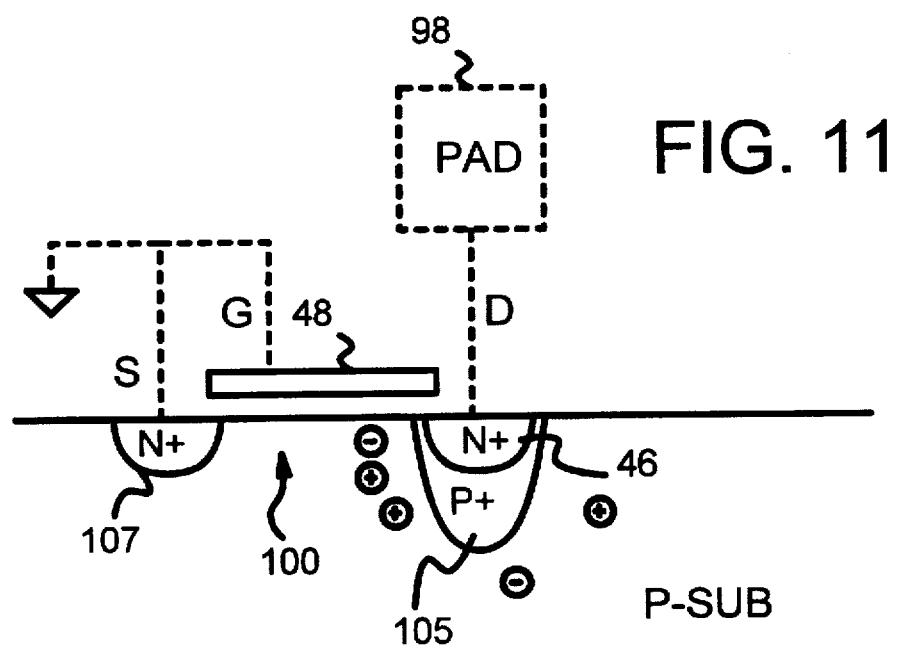
FIG. 11 shows an input-protection transistor with a deep p-type implant for generating avalanche electrons.

FIG. 11 shows an input-protection transistor with a deep p-type implant for generating avalanche electrons. The device of FIG. 11 operates in a similar way to that of FIG. 10. However, the p+ region 105 is formed under n+ drain 46 rather than spaced laterally away from it. Avalanche electrons are generated by the diode from n+ drain 46 to p+ region 105 when a large voltage spike occur on I/O pad 98 during an ESD event. Since ESD events are short-lived, the structure of FIG. 11 may provide better ESD protection since the electrons are generated nearer to punch-through transistor 100. Punch-through occurs more rapidly since the electrons are closer to the conduction path. Extra processing steps as described for FIG. 9 are required.

The punch-through transistor 100 is sometimes referred to as a snap-back device. The avalanche electrons make the parasitic NPN device turn on more easily as minority carriers are generated by the additional avalanche p+ region. Traditional approaches have used an extra n-type implant under the n+ drain rather than the invention's p-type implant. The traditional n-type ESD implant produces a deeper drain which has worse short-channel and punch-through characteristics. Longer channel lengths are used for ESD transistors because of these effects. Unfortunately the longer channel lengths reduce current drive during normal operation when the ESD device is also an output driver transistor. The invention allows smaller channel lengths to be used while still providing good ESD protection as the additional p+ region forms an avalanche diode which generates avalanche carriers when breakdown is needed to shunt ESD-generated current.

ALTERNATE EMBODIMENTS

Several other embodiments are contemplated by the inventors. For example other devices such as ESD devices can use the avalanche-electron generator. A single-poly EPROM or EEPROM cell uses the PMOS transistor to capacitively couple the word-line voltage into the floating gate. This PMOS transistor acts as a capacitor and could be replaced by another capacitive device such as a simple capacitor. An active transistor is not required. A device with either the negative (n) conductivity type or the opposite positive (p) conductivity type can be constructed.

The invention can be combined with a tunneling oxide. The tunneling oxide can be used for erase while avalanche-electron-injection used for programming the erasable-programmable cell. When packaged in a plastic package without a UV-transparent window, an EPROM cell without a tunneling oxide is not erasable but is one-time-only programmable. The p+ region for generating avalanche electrons has been described as a p+ region without a metal contact. Electrical connection to ground is made through the p-type substrate. The size of the p+ region can be enlarged to provide a metal contact to ground metal.

Various layouts can be used. Comers of active areas may be rounded or smoothed out as is well-known in the layout art. Guard rings and taps are often added. Single-poly cells are sensitive to parasitic capacitances on the gates node which decrease the coupling ratio and require that a larger word-line voltage be used. Theories of operation have been presented as is best understood, but actual device operation may follow properties or physical laws unknown to the inventors. The disclosure is meant to describe how to make and use the invention regardless of whether these theories of operation are absolutely correct.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An avalanche-enhanced transistor comprising:
   a source diffusion of a first conductivity type in a substrate of an opposite conductivity type;
   a drain diffusion of the first conductivity type in the substrate;
   a channel region in the substrate between the source diffusion and the drain diffusion for selectively conducting current between the source diffusion and the drain diffusion;
   a control gate for controlling the current between the source diffusion and the drain diffusion; and
   an avalanche-generating diffusion of the opposite conductive type, the avalanche-generating diffusion in close proximity to the drain diffusion, wherein most of the avalanche-generating diffusion is not located directly between the source diffusion and the drain diffusion;
   wherein the avalanche-generating diffusion and the drain diffusion form an avalanche-breakdown diode;
   wherein when a critical reverse voltage bias is applied to the avalanche-breakdown diode between the drain diffusion and the avalanche-generating diffusion, an electric field between the drain diffusion and the avalanche-generating diffusion is sufficiently intense to initiate avalanche breakdown, the avalanche-breakdown diode becoming conducting in a reverse direction when the critical reverse voltage bias is applied;
   wherein the critical reverse voltage bias is less than a transistor channel-avalanche voltage when a channel bias is applied between the source diffusion and the drain diffusion, the channel bias sufficient to generate avalanche breakdown in the channel between the source diffusion and the drain diffusion,
   whereby the avalanche-generating diffusion in close proximity to the drain diffusion initiates avalanche breakdown when the critical reverse voltage bias is applied, and whereby avalanche breakdown occurs at a lower voltage in the avalanche-breakdown diode than in the channel of the avalanche-enhanced transistor.

2. The avalanche-enhanced transistor of claim 1 wherein the critical reverse voltage bias is less than a voltage to generate sufficient hot electrons for programming when a channel bias is applied between the source diffusion and the drain diffusion, the channel bias sufficient to generate avalanche breakdown in the channel between the source diffusion and the drain diffusion,
   whereby avalanche breakdown occurs at a lower voltage in the avalanche-breakdown diode than in the channel of the avalanche-enhanced transistor.

3. The avalanche-enhanced transistor of claim 1 wherein the source diffusion, the substrate, and the avalanche-generating diffusion are each connected to a constant-voltage terminal and wherein the drain diffusion is connected to a variable-voltage signal.

4. The avalanche-enhanced transistor of claim 3 wherein the control gate is also connected to the constant-voltage terminal and wherein the variable-voltage signal connected to the drain diffusion is connected to an input/output pad of an integrated circuit, the avalanche-enhanced transistor providing protection from electro-static discharges applied to the input/output pad.

5. The avalanche-enhanced transistor of claim 4 wherein the constant-voltage terminal is selected from the group consisting of a ground supply terminal and a power-supply terminal.

6. The avalanche-enhanced transistor of claim 3 wherein the control gate is isolated from all D.C. current sources and sinks and wherein the variable-voltage signal connected to the drain diffusion is connected to a bit line, the avalanche-enhanced transistor being a non-volatile memory cell, programming means for capacitively coupling a gate programming voltage into the control gate and for applying the critical reverse voltage bias to the drain diffusion;
   wherein the avalanche-breakdown diode generates high-energy charged carriers when the critical reverse voltage bias is applied, the high-energy charged carriers injected into the control gate when the gate programming voltage is coupled to the control gate,
   whereby the high-energy charged carriers change a charge on the control gate to program the non-volatile memory cell.

7. The avalanche-enhanced transistor of claim 3 wherein the avalanche-generating diffusion is laterally separated from the drain diffusion by the substrate, a lateral distance from the drain diffusion to the avalanche-generating diffusion determining a magnitude of the critical reverse voltage bias when avalanche breakdown occurs.

8. The avalanche-enhanced transistor of claim 3 wherein the avalanche-generating diffusion is located directly underneath the drain diffusion.

9. A non-volatile memory cell comprising:
   a MOS transistor having a source diffusion of a first conductivity type and a drain diffusion of the first conductivity type in a substrate of a second conductivity type, the second conductivity type opposite of the first conductivity type, the MOS transistor having an isolated gate;
   an avalanching diffusion of the second conductivity type, the avalanching diffusion separated by a lateral distance W from the drain diffusion in a direction away from the source diffusion, the lateral distance W sufficiently small that a depletion region extends from the drain diffusion to the avalanching diffusion when a reverse bias is applied across the drain diffusion to the avalanching diffusion, the avalanching diffusion for generating an avalanche of free carriers when a critical reverse bias is applied; and
   coupling means for capacitively coupling a programming voltage to the isolated gate, the programming voltage attracting the free carriers generated by the avalanching diffusion into the isolated gate,
   whereby the isolated gate is programmed by the free carriers generated by the avalanching diffusion.

10. The non-volatile memory cell of claim 9 wherein the avalanching diffusion is separated from the drain diffusion by the substrate, the substrate having a light doping but the avalanching diffusion and the drain diffusion having a heavy doping,
    wherein a critical electric field is strong enough to sufficiently energize free carriers to break other carriers free in an avalanche breakdown, the critical electric field being reached when the depletion region is formed from the drain diffusion across the substrate to the avalanching diffusion,
    wherein avalanche breakdown does not occur until the depletion region reaches across the substrate to the avalanching diffusion.

11. The non-volatile memory cell of claim 10 wherein the reverse bias which generates the critical electric field is no greater than a power-supply voltage for normal operation of an integrated circuit containing the non-volatile memory cell,
    whereby a programming voltage for the drain diffusion is not generated by a charge pump or by a second programming power supply.

12. The non-volatile memory cell of claim 11 wherein the first conductivity type is n-type, the source diffusion and the drain diffusion are highly-doped n+ regions while the avalanche diffusion is a highly-doped p+ region and the substrate is lightly-doped p-type.

13. The non-volatile memory cell of claim 11 wherein the non-volatile memory cell is located on an integrated circuit with other non-volatile memory cells having a different value for the lateral distance W, wherein the different values for the lateral distance W produce non-volatile memory cells with different values of the reverse bias required to generate free carriers in the avalanching diffusion, whereby different programming voltages are required for different non-volatile memory cells having different values of the lateral distance W.

14. A transistor-diode device comprising:

an n-channel transistor having a gate and an n+ source diffusion and an n+ drain diffusion formed in a p-type substrate;

a p+ diffusion adjacent to the n+ drain diffusion, the p+ diffusion not located under the gate of the n-channel transistor; and biasing means for electrically biasing the p+ diffusion at a same voltage as a voltage of the p-type substrate;

breakdown bias means for applying a drain voltage to the n+ drain diffusion, the drain voltage creating a depletion region extending from the n+ drain diffusion to the p+ diffusion, the depletion region having a sufficiently strong electric field when the drain voltage is applied that avalanche breakdown of electrons occurs;

wherein the drain voltage does not cause avalanche breakdown under the gate of the n-channel transistor but only causes avalanche breakdown in the depletion region between the n+ drain diffusion and the p+ diffusion, whereby avalanche breakdown of electrons occurs at the p+ diffusion and not under the gate of the n-channel transistor.

15. The transistor-diode device of claim 14 operating as a non-volatile memory cell, wherein the gate of the n-channel transistor is an isolated gate capacitively coupled to a word line;

wherein when a gate voltage is applied to the word line and coupled to the gate, the drain voltage applied to the n+ drain diffusion generates the avalanche breakdown of electrons which are drawn into the gate to charge the gate, whereby the gate is programmed by the avalanche breakdown of electrons from the p+ diffusion adjacent to the n+ drain diffusion.

16. The transistor-diode device of claim 15 wherein the p+ diffusion is implanted with p-type dopant simultaneously when p+ sources and drains of p-channel transistors are implanted with p-type dopant, whereby the p+ diffusion is formed simultaneously with p+ sources and drains, without additional processing steps beyond a standard CMOS process.

17. The transistor-diode device of claim 16 further comprising:

a p-channel transistor having a gate coupled to the gate of the n-channel transistor, the p-channel transistor having a drain and a source and an n-well tap all connected to the word line, the p-channel transistor for capacitvely coupling the word line to the gate of the n-channel transistor, whereby a single-polysilicon non-volatile memory cell uses the p+ diffusion to generate electrons for programming.

18. The transistor-diode device of claim 14 operating as an ESD-protection device, wherein the n+ source diffusion is connected to a ground and the p-type substrate and the p+ diffusion and the gate are connected to the ground and the n+ drain diffusion is connected to an external pad, wherein a breakdown voltage from the n+ drain diffusion to the n+ source diffusion is higher than an avalanche breakdown voltage of the n+ drain diffusion to the p+ diffusion;

wherein high voltages applied to the external pad generate the avalanche breakdown of electrons in the p+ diffusion before breakdown occurs in the n-channel transistor.

* * * * *